(12) United States Patent
Kim et al.

(10) Patent No.: US 9,105,643 B2
(45) Date of Patent: Aug. 11, 2015

(54) BIT CELL WITH DOUBLE PATTERNED METAL LAYER STRUCTURES

(71) Applicant: GLOBALFOUNDRIES Inc., Grand Cayman (KY)

(72) Inventors: Juhan Kim, Santa Clara, CA (US); Mahbub Rashed, Cupertino, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/337,596

(22) Filed: Jul. 22, 2014

(65) Prior Publication Data

US 2014/0332967 A1  Nov. 13, 2014

Related U.S. Application Data

(62) Division of application No. 13/617,853, filed on Sep. 14, 2012, now Pat. No. 8,823,178.

(51) Int. Cl.
| | |
|---|---|
| *H01L 29/40* | (2006.01) |
| *H01L 23/48* | (2006.01) |
| *H01L 21/337* | (2006.01) |
| *H01L 21/205* | (2006.01) |
| *H01L 23/538* | (2006.01) |
| *H01L 27/02* | (2006.01) |
| *H01L 27/11* | (2006.01) |

(52) U.S. Cl.
CPC ........ *H01L 23/5386* (2013.01); *H01L 27/0207* (2013.01); *H01L 27/11* (2013.01); *H01L 27/1104* (2013.01)

(58) Field of Classification Search
CPC ........................ H01L 23/5386; H01L 27/0207

USPC ............ 257/773, 379, E21.09; 438/186, 478, 438/587, 637
See application file for complete search history.

(56) References Cited

U.S. PATENT DOCUMENTS

| | | |
|---|---|---|
| 6,271,063 B1 | 8/2001 | Chan et al. |
| 6,737,685 B2 | 5/2004 | Aipperspach et al. |
| 8,076,236 B2 | 12/2011 | Schultz et al. |
| 2002/0117722 A1 | 8/2002 | Osada et al. |
| 2003/0123279 A1 | 7/2003 | Aipperspach et al. |
| 2004/0196705 A1 | 10/2004 | Ishikura et al. |
| 2006/0019488 A1 | 1/2006 | Liaw |

(Continued)

OTHER PUBLICATIONS

Taiwanese Office Action (English Language Summary Included) for related Taiwanese Patent Application No. 102113903 dated Apr. 15, 2015, 16 pages.

*Primary Examiner* — Long K Tran
*Assistant Examiner* — Dzung Tran
(74) *Attorney, Agent, or Firm* — Ditthavong & Steiner, P.C.

(57) ABSTRACT

An approach for providing SRAM bit cells with double patterned metal layer structures is disclosed. Embodiments include: providing, via a first patterning process, a word line structure, a ground line structure, a power line structure, or a combination thereof; and providing, via a second patterning process, a bit line structure proximate the word line structure, the ground line structure, the power line structure, or a combination thereof. Embodiments include: providing a first landing pad as the word line structure, and a second landing pad as the ground line structure; and providing the first landing pad to have a first tip edge and a first side edge, and the second landing pad to have a second tip edge and a second side edge, wherein the first side edge faces the second side edge.

12 Claims, 8 Drawing Sheets

(56) References Cited

U.S. PATENT DOCUMENTS

| | | |
|---|---|---|
| 2006/0121715 A1* | 6/2006 | Chang et al. .................. 438/599 |
| 2008/0083991 A1* | 4/2008 | Yang et al. .................... 257/758 |
| 2008/0192561 A1* | 8/2008 | Huang et al. ............. 365/230.05 |
| 2009/0168498 A1* | 7/2009 | Pillarisetty et al. ........... 365/154 |
| 2009/0187877 A1* | 7/2009 | Vickery, III ..................... 716/19 |
| 2011/0111330 A1 | 5/2011 | Schultz et al. |
| 2011/0269275 A1 | 11/2011 | Yang et al. |
| 2012/0108036 A1 | 5/2012 | Chang et al. |

* cited by examiner

BIT CELL WITH DOUBLE PATTERNED METAL LAYER STRUCTURES

CROSS REFERENCE TO RELATED APPLICATIONS

This application is a Divisional Application of U.S. application Ser. No. 13/617,853, filed Sep. 14, 2012, the content of which is incorporated herein by reference

TECHNICAL FIELD

The present disclosure relates to fabrication of miniaturized static random access memory (SRAM) bit cells. The present disclosure is particularly applicable to SRAM bit cells for 20 nanometer (nm) technology nodes and beyond (e.g., 14 nm and other technology nodes).

BACKGROUND

As technology advances, and the dimensions of transistor devices continue to shrink, difficulty increases with respect to maintaining lithographic printability of designs for fabrication of semiconductor devices. For example, a known SRAM bit cell 100 in FIG. 1A includes metal1 landing pads 101 for word lines, metal1 landing pads 103 for ground lines, and metal1 bit line structures 105, and metal2 layer structures 107. In addition, bit cell 100 includes active region contacts 109, metal contacts 111, and via1 structures 113 for performing various interconnections associated with the metal1 layer structures 101, 103, and 105, and the metal2 layer structures 107. However, bit cell 100 may be difficult to print on a wafer because metal structures of the same color (or patterning) in bit cell 100 are too close to each other. As shown, for instance, word line landing pads 101 may be too close to ground line landing pads 103, and landing pads 101 and 103 may be too close to bit line structures 105. As such, it may become increasingly difficult to further shrink the design of bit cell 100. Moreover, as illustrated by another known SRAM bit cell 130 in FIG. 1B, single patterned metal lines (e.g., metal1 layer structures 131 and 133) occupy significant space. However, if the height of bit cell 130 is reduced (e.g., to decrease the space occupied), the tip-to-tip spacing between metal1 layer structures 133 (in which the tip is the short side of the structure), particularly in same color space, will become too close, negatively affecting lithographic printability of bit cell 130.

A need therefore exists for a miniaturized SRAM bit cell with improved lithographic printability, and enabling methodology.

SUMMARY

An aspect of the present disclosure is a method for implementing a bit cell with double patterned metal layer structures.

Another aspect of the present disclosure is a device implemented with bit cells having double patterned metal layer structures.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing, via a first patterning process, a word line structure, a ground line structure, a power line structure, or a combination thereof; and providing, via a second patterning process, a bit line structure proximate the word line structure, the ground line structure, the power line structure, or a combination thereof.

Aspects of the present disclosure include: providing a first landing pad as the word line structure, and a second landing pad as the ground line structure; and providing the first landing pad to have a first tip edge and a first side edge, and the second landing pad to have a second tip edge and a second side edge, wherein the first side edge faces the second side edge. Additional aspects include: providing the bit line structure to have a third tip edge and a third side edge; and providing the first and second tip edges to be parallel to the third side edge. Various aspects include the bit line structure, the word line structure, the ground line structure, and the power line structure being metal1 layer structures. Other aspects include providing double patterning with respect to the metal1 layer structures using the first and second patterning processes. Using double pattering, the first color metal and the second color metal can be closely spaced to reduce bit cell area, while two same color metals cannot be.

Certain aspects include providing the first side edge, the second side edge, or a combination thereof to be 1.4 to 1.8 times longer than the first tip edge, the second tip edge, or a combination thereof. Some aspects include providing the first side edge to be 50 nm to 60 nm away from the second side edge. Other aspects include providing the first tip edge to be perpendicular to the first side edge, the second tip edge to be perpendicular to the second side edge, or a combination thereof. Further aspects include: providing, via the second patterning process, a second bit line structure; and providing the word line structure, the ground line structure, the power line structure, or a combination thereof between the bit line structure and the second bit line structure. Using a side-to-side structure, the first landing pad and the second landing pad can be closely spaced to reduce bit cell area, even though the two landing pads are same color pattern.

An additional aspect of the present disclosure is a device including: a word line structure having a first tip edge and a first side edge; a ground line structure having a second tip edge and a second side edge, wherein the first side edge faces the second side edge; a power line structure; and a bit line structure proximate the word line structure, the ground line structure, and the power line structure.

Aspects include the bit line structure having a third tip edge and a third side edge, and the first and second tip edges being parallel to the third side edge. Additional aspects include the first side edge, the second side edge, or a combination thereof being 1.4 to 1.8 times longer than the first tip edge, the second tip edge, or a combination thereof. Some aspects include the first side edge being 50 nm to 60 nm away from the second side edge. Certain aspects include the first tip edge being perpendicular to the first side edge, the second tip edge is perpendicular to the second side edge, or a combination thereof. Other aspects include the bit line structure, the word line structure, the ground line structure, and the power line structure being metal1 layer structures.

Another aspect of the present disclosure includes: providing, via a first patterning process, a word line structure having a first tip edge and a first side edge; providing, via the first patterning process, a ground line structure having a second tip edge and a second side edge, wherein the first side edge faces the second side edge; and providing, via a second patterning process, a bit line structure proximate the word line structure and the ground line structure.

Additional aspects include: providing the bit line structure to have a third tip edge and a third side edge; and providing the first and second tip edges to be parallel to the third side edge. Some aspects include providing the first side edge, the second side edge, or a combination thereof to be 1.4 to 1.8 times longer than the first tip edge, the second tip edge, or a combination thereof. Various aspects include providing, via the first patterning process, a power line structure proximate the bit line structure. Further aspects include the bit line structure, the word line structure, the ground line structure, and the power line structure being metal1 layer structures.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problems of lithographic difficulties attendant upon fabrication of bit cells having single patterned metal layer structures. The present disclosure addresses and solves such problems, for instance, by, inter alia, providing a word line structure, a ground line structure, a power line structure, or a combination thereof of a bit cell with a first patterning process, and a bit line structure of the bit cell with a second patterning process.

Figure 1A:
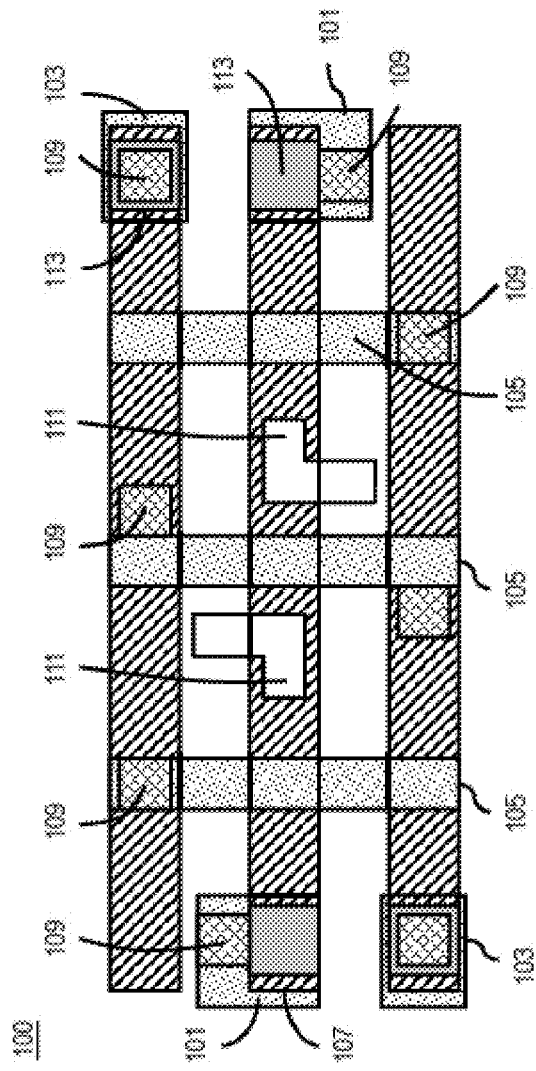
FIGS. 1A and 1B schematically illustrate SRAM bit cells with single patterned metal layer structures.
Figure 1B:
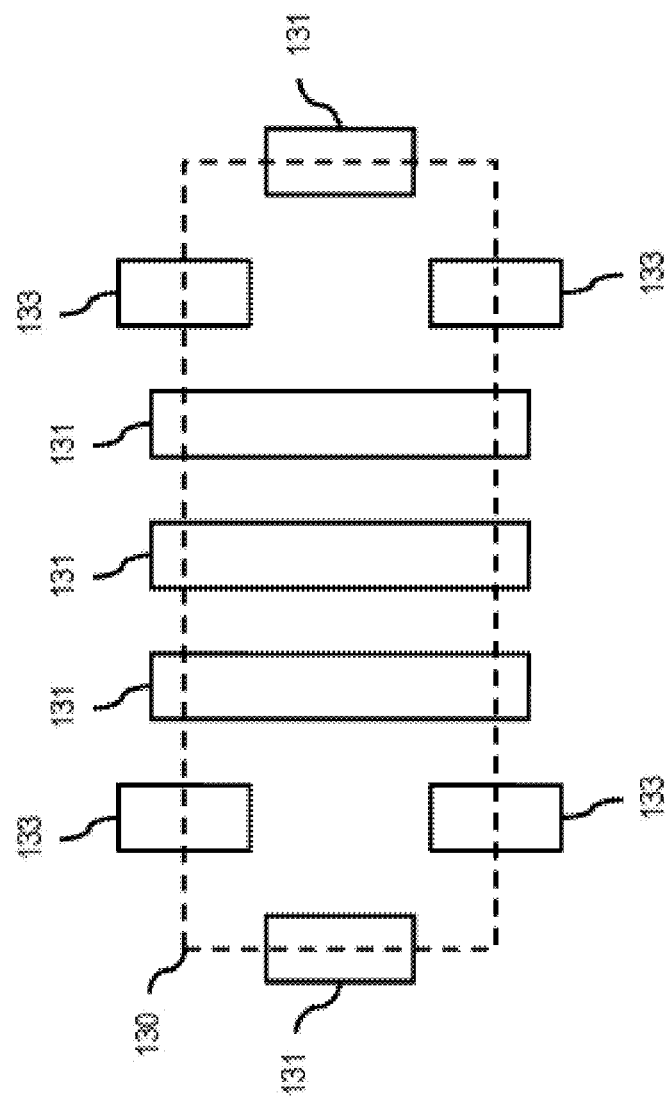
Figure 2:
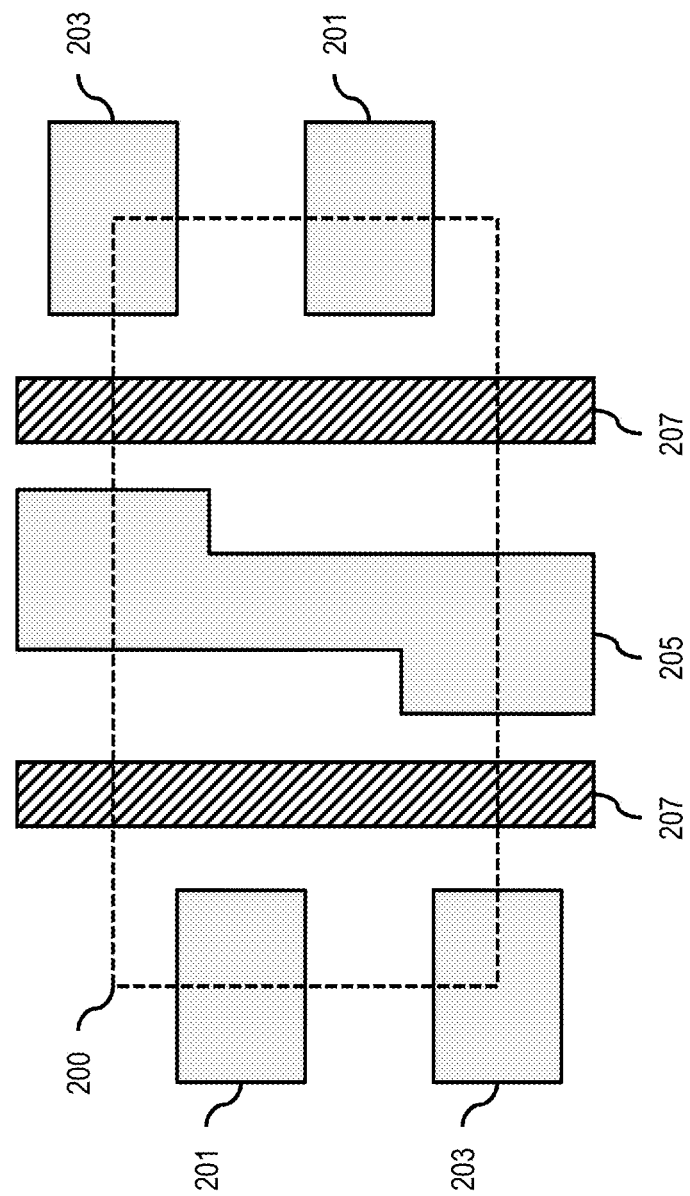
FIG. 2 schematically illustrates a bit cell with double patterned metal layer structures, in accordance with an exemplary embodiment of the present disclosure.

FIG. 2 schematically illustrates a bit cell with double patterned metal layer structures, in accordance with an exemplary embodiment of the present disclosure. For example, bit cell 200 includes metal1 word line structures 201, metal1 ground line structures 203, metal1 power line structure 205, and metal1 bit line structures 207 (e.g., metal1 landing pads for connecting to word lines, ground lines, power lines, and bit lines, respectively). As shown, the same pattern (or same color) is utilized to print metal1 word line structures 201, metal1 ground line structures 203, and metal1 power line structures 205, while a different pattern (or different color) is utilized to print metal1 bit line structures 207. This double patterning technique (of litho-etch-litho-etch (LELE)) applied to the above-mentioned metal1 layer structures decreases the necessary space between the various metal1 layer structures and, thus, may reduce the overall size of devices implemented with bit cell 200, while maintaining the lithographic printability quality of bit cell 200 during fabrication of such devices.

In addition, as depicted, metal1 word line structures 201 and metal1 ground line structures 203 are rectangular in shape, each having two tip edges and two side edges. As used herein, side edges of a structure are edges longer than tip edges of the structure (e.g., a side edge of a structure may be about 1.5 times longer than a tip edge of the structure). As illustrated, each metal1 word line structure 201 has a side edge that oppositely faces a side edge of a metal1 ground line structure 203, and each of the metal1 word line structures 201 and the metal1 ground line structures 203 has a tip edge that oppositely faces a side edge of a metal1 bitline structure 207, which is formed as a vertical line. Side edges of the metal1 word line structure 201 and the metal1 ground line structure 203 may be 1.4 to 1.8 times longer than tip edges of the metal1 word line structure 201 and the metal1 ground line structure 203, respectively.

As a result of the double patterning, the spacing between particular metal layer structures of different colors may be reduced. For example, the tip-to-side space between a metal1 word line structure 201 and a metal1 bit line structure 207, and the tip-to-side space between a metal1 ground line structure 203 and a metal1 bit line structure 207 of bit cell 200 are significantly narrower than their respective space counterparts in a typical bit cell. Moreover, because of the shape and the arrangement of the components of bit cell 200, the spacing between particular metal layer structures of the same color may also be decreased. For example, the side-to-side space between a metal1 word line structure 201 and a metal1 ground line structure 203 of bit cell 200 are significantly narrower than the tip-to-tip, side-to-tip, or tip-to-side space between a metal1 word line structure and a metal1 ground line structure of a typical bit cell (e.g., since side-to-side space can be more tightly controlled in processing metal layer structures). Oppositely facing side edges of a metal1 word line structure 201 and a metal1 ground line structure 203, for instance, may be 50 nm to 60 nm away from each other, where dimensions of the metal1 landing pad are about 58 nm in height and about 98 nm in length, and the dimension of the bit line is about 32 nm. In this way, the size of devices may further be reduced while the quality of lithographic printability of such devices may be maintained.

Figure 3:
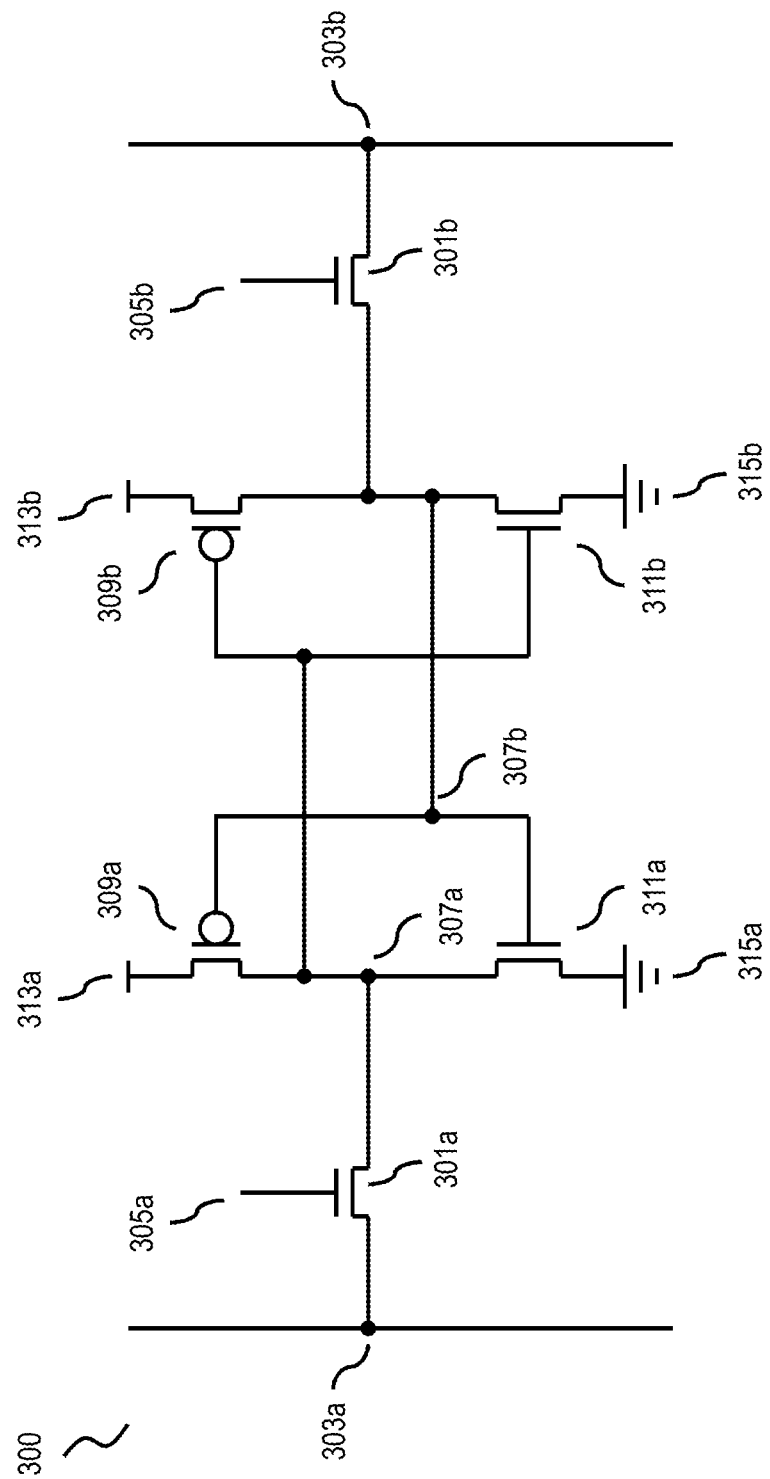
FIG. 3 schematically illustrates a circuit diagram of a bit cell with doubled patterned metal layer structures, in accordance with an exemplary embodiment of the present disclosure.

FIG. 3 schematically illustrates a circuit diagram of a bit cell with doubled patterned metal layer structures, in accordance with an exemplary embodiment of the present disclosure. As shown, bit cell 300 includes pass-gates 301a and 301b and inverters. Each pass-gate 301a (301b) is connected to a bit line 303a (303b), a word line 305a (305b), and an internal node 307a (307b). Each inverter includes a PMOS 309a (309b) and a NMOS 311a (311b), and is connected to a power line 313a (313b) (e.g., via its PMOS 309a (309b)) and a ground line 315a (315b) (e.g., via its NMOS 311a (311b)).

Figure 4:
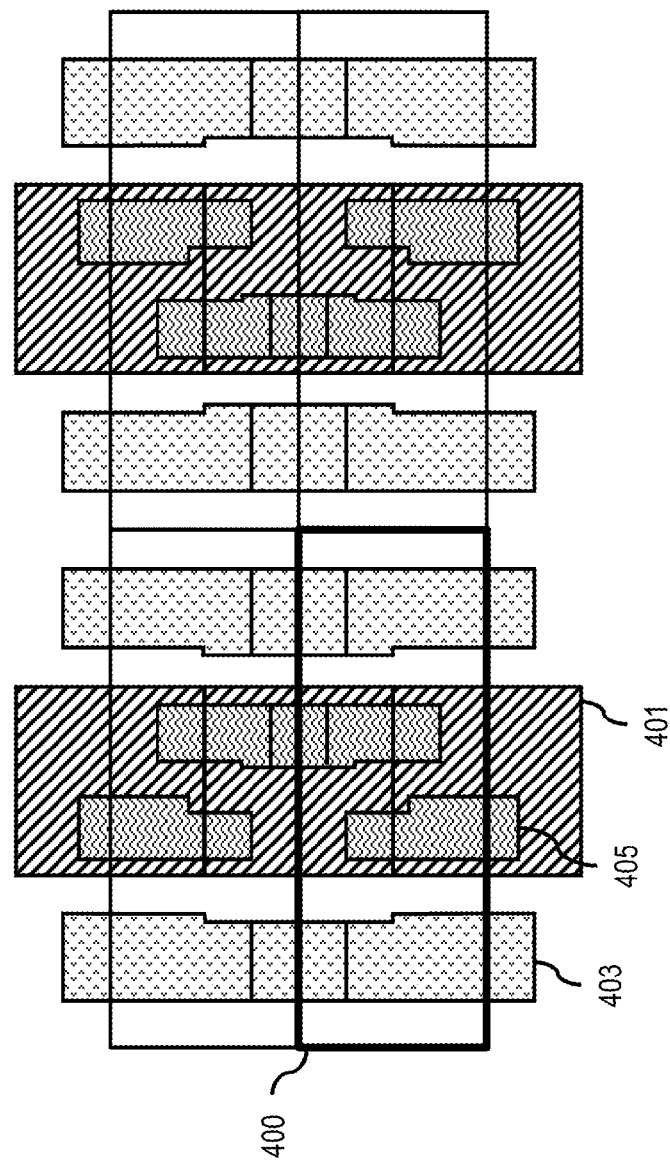
FIG. 4 schematically illustrates n-well region and active regions associated with a bit cell having double patterned metal layer structures, in accordance with an exemplary embodiment of the present disclosure.

FIG. 4 schematically illustrates n-well regions and active regions associated with a bit cell having double patterned metal layer structures, in accordance with an exemplary embodiment of the present disclosure. As depicted, bit cell 400 represents one of the bit cells of a 2×2 array of bit cells. Moreover, as shown, bit cell 400 may be formed from base layers that include n-well regions 401, n-active regions 403, and p-active regions 405.

Figure 5:
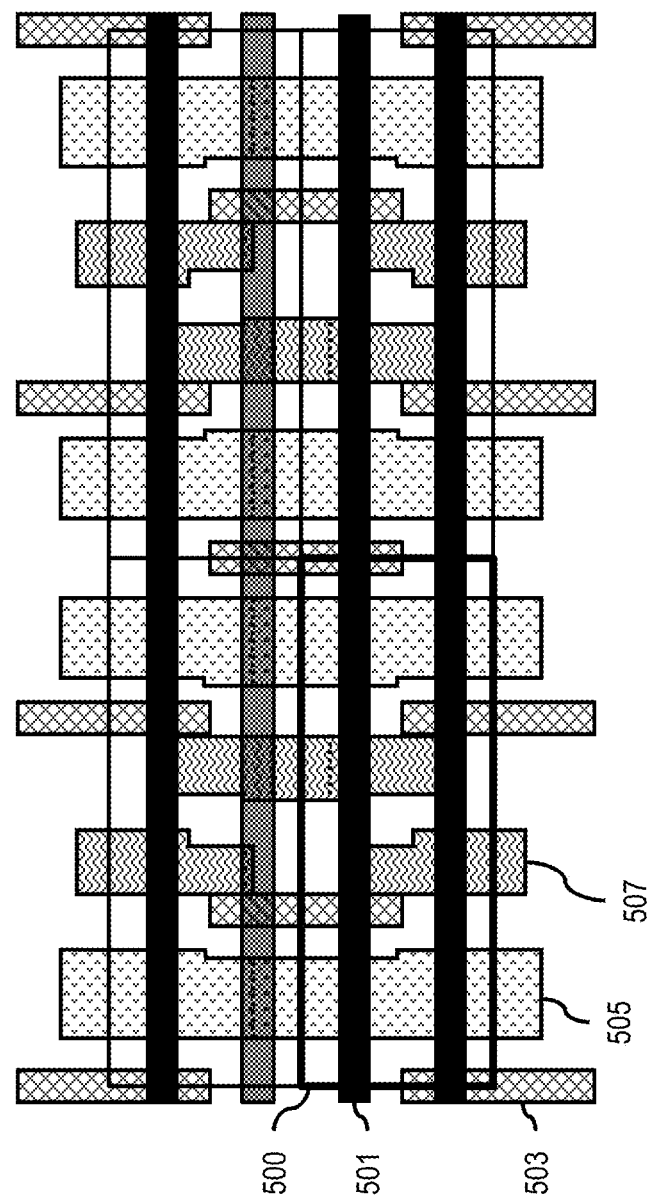
FIG. 5 schematically illustrates poly structures and polycut regions associated with a bit cell having doubled patterned metal layer structures, in accordance with an exemplary embodiment of the present disclosure; via0 structures associated with a bit cell having doubled patterned metal layer structures, in accordance with an exemplary embodiment of the present disclosure.

FIG. 5 schematically illustrates poly structures and poly-cut regions associated with a bit cell having doubled patterned metal layer structures, in accordance with an exemplary embodiment of the present disclosure. As illustrated, bit cell 500 (e.g., one of the bit cells of a 2×2 array of bit cells) may include poly structures 501 for forming transistor gates, and poly-cut regions 503 for cutting poly structures 501. In addition, poly structures 501 may be formed on n-active regions 505 and p-active regions 507.

Figure 6:
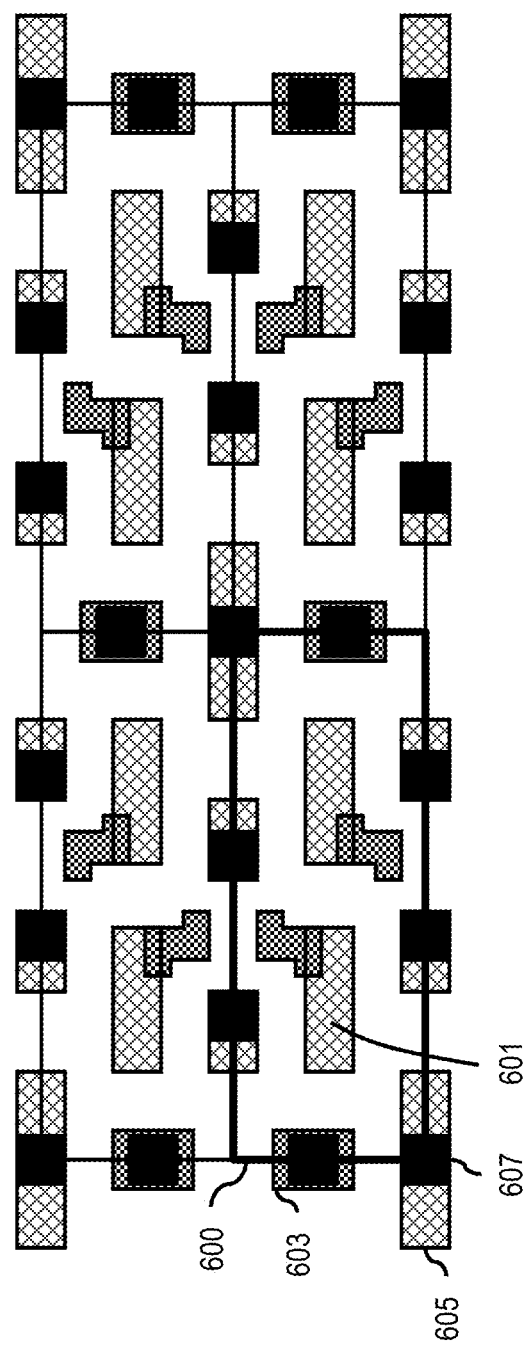

FIG. 6 schematically illustrates active region contacts, gate contacts, and via0 structures associated with a bit cell having doubled patterned metal layer structures, in accordance with an exemplary embodiment of the present disclosure. As depicted, bit cell 600 (e.g., one of the bit cells of a 2×2 array of bit cells) may include active region contacts and gate contacts for local interconnections. For example, active region contact 601 may be used for connecting to n-active regions 505 and p-active regions 507 in FIG. 5, and for connecting to an internal node 307 (e.g., internal node 307b) in FIG. 3. Gate contact 603 may be used for connecting to a word line 305 (e.g., word line 305a) in FIG. 3. Active region contact 605 may be used for connecting to a ground node 315 (e.g., ground node 315a) in FIG. 3. In addition, bit cell 600 may include via0 structures 607 for connecting to metal1 layer structures (e.g., metal1 layer structures of FIG. 7).

Figure 7:
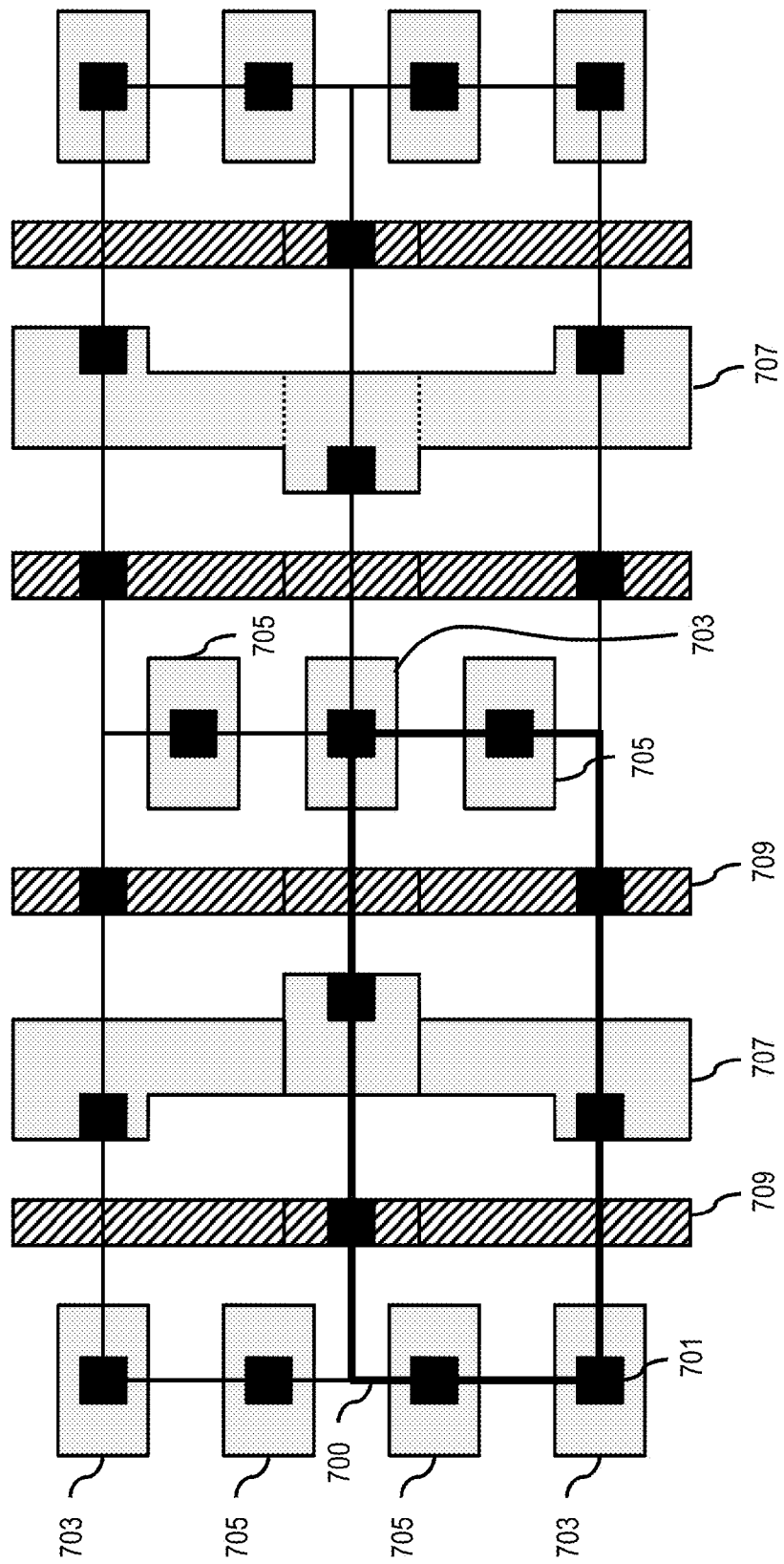
FIG. 7 schematically illustrates via0 structures and metal1 layer structures associated with a bit cell having doubled patterned metal layer structures, in accordance with an exemplary embodiment of the present disclosure.

FIG. 7 schematically illustrates via0 structures and metal1 layer structures associated with a bit cell having doubled patterned metal layer structures, in accordance with an exemplary embodiment of the present disclosure. Bit cell 700 (e.g., one of the bit cells of a 2×2 array of bit cells) may include via0 structures 701 for connecting metal layer structures to active region contacts (e.g., one of the metal1 ground line structures 703 to active region contact 605 of FIG. 6). Metal layer structures of the bit cell 700 may include metal1 ground line structures 703, metal1 word line structures 705, metal1 power line structure 707, and metal1 bit line structures 709, and may be used to connect lower layers to upper layers (not shown for illustrative convenience). For example, metal1 ground line structures 703 may be used to connect to upper layers to provide ground potential to various lower layers of bit cell 700.

As indicated, metal1 ground line structures 703, metal1 word line structures 705, and metal1 power line structures 707 may be a first color (or first pattern), and metal1 bit line structures 709 may be a second color (or second pattern). As a result of the double patterning, space between certain metal layer structures (e.g., metal layer structures that are of different colors) may be effectively reduced without negatively affecting lithographic printability. In addition, as discussed, the metal1 layer structures may be shaped and arranged to also reduce space between metal layer structures of the same color (or same pattern). For example, the side-to-side space between a metal1 ground line structure 703 and a metal1 word line structure 705 of bit cell 700 are significantly narrower than the tip-to-tip, side-to-tip, or tip-to-side space between a metal1 word line structure and a metal1 ground line structure of a typical bit cell (e.g., since side-to-side space can be more tightly controlled in processing metal layer structures).

The embodiments of the present disclosure can achieve several technical effects, including reduced bit cell size, improved lithographic printability associated with device fabrication, etc. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly in 20 nm technologies nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   at least one word line structure having a first tip edge and a first side edge;
   at least one ground line structure having a second tip edge and a second side edge;
   at least one power line structure;
   and at least one bit line structure proximate the at least one word line structure, the at least one ground line structure, and the at least one power line structure;
   the at least one word line structure, the at least one ground line structure, the at least one power line structure, and the at least one bit line structure together providing at least one double patterned metal layer structure, wherein the at least one double patterned metal layer structure is connected to active region contacts and gate contacts;
   wherein the first side edge faces the second side edge;
   wherein the first tip edge is perpendicular to the first side edge and the second tip edge is perpendicular to the second side edge; and
   wherein the bit line structure has a third tip edge and a third side edge, and the first and second tip edges are parallel to the third side edge.

2. The device according to claim 1, wherein the first side edge, the second side edge, or a combination thereof are 1.4 to 1.8 times longer than the first tip edge, the second tip edge, or a combination thereof.

3. The device according to claim 1, wherein the first side edge is 50 nm to 60 nm away from the second side edge.

4. The device according to claim 1, wherein the at least one bit line structure, the at least one word line structure, the at least one ground line structure, and the at least one power line structure are metal1 layer structures.

5. The device according to claim 4, wherein the at least one metal1 word line structure, the at least one metal1 ground line structure, and the at least one metal1 power line structure are formed by a first pattern.

6. The device according to claim 5, wherein the at least one metal1 bit line structure is formed by a second pattern different from the first pattern.

7. A Static Random Access Memory (SRAM) bit cell, comprising:
- at least one word line structure having a first tip edge and a first side edge;
- at least one ground line structure having a second tip edge and a second side edge;
- at least one power line structure; and
- at least one bit line structure proximate the at least one word line structure, the at least one ground line structure, and the at least one power line structure; the at least one word line structure, the at least one ground line structure, the at least one power line structure, and the at least one bit line structure together providing at least one double patterned metal layer structure, wherein the at least one double patterned metal layer structure is connected to active region contacts and gate contacts,
- wherein the first side edge faces the second side edge, the first tip edge is perpendicular to the first side edge and the second tip edge is perpendicular to the second side edge; and
- wherein the bit line structure has a third tip edge and a third side edge, and the first and second tip edges are parallel to the third side edge.

8. The SRAM bit cell according to claim 7, wherein the first side edge, the second side edge, or a combination thereof are 1.4 to 1.8 times longer than the first tip edge, the second tip edge, or a combination thereof.

9. The SRAM bit cell according to claim 7, wherein the first side edge is 50 nm to 60 nm away from the second side edge.

10. The SRAM bit cell according to claim 7, wherein the at least one bit line structure, the at least one word line structure, the at least one ground line structure, and the at least one power line structure are metal1 layer structures.

11. The SRAM bit cell according to claim 10, wherein the at least one metal1 word line structure, the at least one metal1 ground line structure, and the at least one metal1 power line structure are formed by a first pattern.

12. The SRAM bit cell according to claim 1, wherein the at least one metal1 bit line structure is formed by a second pattern different from the first pattern.

* * * * *